(12) United States Patent
Bracchitta et al.

(10) Patent No.: US 6,339,015 B1
(45) Date of Patent: Jan. 15, 2002

(54) METHOD OF FABRICATING A NON-VOLATILE SEMICONDUCTOR DEVICE

(75) Inventors: John A. Bracchitta, So. Burlington; James S. Nakos, Essex, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/574,410

(22) Filed: May 18, 2000

Related U.S. Application Data

(62) Division of application No. 09/093,165, filed on Jun. 8, 1998.

(51) Int. Cl.[7] .............................................. H01L 21/38
(52) U.S. Cl. ........................ 438/565; 438/305; 438/519
(58) Field of Search ................................. 438/565, 566, 438/305, 529, 545, 549, 519, 527, 524

(56) References Cited

U.S. PATENT DOCUMENTS 5,886,373 A * 3/1999 Hosogi 6,232,633 B1 * 5/2001 Bracchitta et al.

* cited by examiner

Primary Examiner—Caridad Everhart
(74) Attorney, Agent, or Firm—Scully, Scott, Murphy & Presser; Eugene I. Shkurko

(57) ABSTRACT

A non-volatile random access memory (NVRAM) cell and methods of forming thereof are disclosed. The NVRAM cell includes a substrate having source and drain regions. A spike having a sharp tip extends in the source region. Instead of a single spike, two adjacent spikes are included in the source. Alternatively, in addition to the single spike in the source, two adjacent spikes are included in the drain. The two adjacent spikes have one tip pointing toward the floating gate and two tips pointing away from the floating gate. The spikes provide high electric field to facilitate charge movement between the floating gate and the source region. A tunnel oxide layer separates the floating gate from the substrate. A gate oxide and a control gate are also formed over the floating gate. The single spike is formed by preferentially etching the substrate along a selected crystal plane through an opening formed in a mask that covers the substrate. The two adjacent spikes are formed by first forming spacers on sidewalls of the opening to reduce a width thereof; filling the reduced opening with a mask plug; removing the sidewalls; and etching the substrate.

15 Claims, 13 Drawing Sheets

METHOD OF FABRICATING A NON-VOLATILE SEMICONDUCTOR DEVICE

CROSS-REFERENCE TO RELATED APPLICATION

This application is a divisional of U.S. patent application, Ser. No. 09/093,165, filed Jun. 8, 1998.

BACKGROUND OF THE INVENTION

1. Field of the Invention

The present invention is directed to an non-volatile random access memory (NVRAM) cell and a method for fabricating thereof, and more particularly, to an NVRAM cell that has a at least one sharp tip or spike extending into a source or drain of the NVRAM cell.

2. Discussion of the Prior Art

Smart cards and mobile applications require low power NVRAM cells, such as electrically erasable programmable read only memories (EEPROM), where their storage state, e.g., logic high or low, is retained after power is removed. Advanced complementary metal oxide semiconductor (CMOS) cells and processes have been aggressively scaled down to reduce cell size and power supply voltage requirements for reading and writing and erasing the NVRAM cells. Scaled NVRAM cells require high voltages for programming or erasing the NVRAM cells. The high voltages associated with programming and erasing the NVRAM cells incompatible with CMOS device scaling.

FIG. 1 shows a schematic of a typical NVRAM cell 100, having a floating gate 110, a control gate 120 and two drain/source terminals 105 and 115. The terminal 105 is the bitline of the cell 100, it may be connected to decode circuitry. For simplicity, hereinafter, the bitline B/L terminal 105 will be referred to as a drain, while the other terminal 115 will be referred to as a source.

Depending on voltages applied to the bitline B/L terminal 105, the control gate 120 and the source 115, the floating gate 110 is charged (written) or discharged (erased). The discharge occurs only through the source terminal 115. A floating gate 110 of the NVRAM cell 100 stores charges.

The floating gate 110 is covered by a dielectric insulating layer 130, such as an oxy-nitride-oxide (ONO) layer, which is a combination of oxide, nitride, and reoxidation of the nitride, in order to retain the stored charges after the completion of writing or erasing operations. The dielectric insulating layer 135 located between the floating gate and the underlying substrate 140 is referred to as a tunnel oxide, which is normally thin to allow electron tunneling between the floating gate and the source (or the drain) of the floating gate transistor 100.

The present disclosure relates to a stacked gate nonvolatile memory cell, where the signal is stored on the floating gate. Those skilled in the art will recognize that these cells can be operated in a number of ways. Two of the best methods used for cell operation are described below. These methods are not intended to be an exhaustive list, however, the practitioners of the art will recognize that they define two major classes for which other operation modes will derive.

Channel Hot Electron Write.

To write the cell 100 in the Channel Hot Electron mode of operation, voltages are applied to the source 115, the drain 105, and the control gate 120 to turn on the channel region 125. In this mode the current through the channel 125 generates hot electrons near the drain region 105. Some small fraction of these hot electrons have enough energy to be injected into the floating gate 110 across the dielectric film 135 separating the floating gate 110 from the channel region 125 and the source 115 and the drain 105 regions. This dielectric film is typically silicon dioxide and is referred to as the tunnel oxide.

A typical set of voltages for an NFET memory cell is putting the source 115 to ground potential 0 volts, placing the drain 105 at a positive voltage typically e.g., 5 volts and placing a high potential on the control gate 120 e.g., 10 volts. The voltage on the floating gate 110 defines the conduction of the conduction region. The floating gate 110 is analogous to the gate on a standard CMOS transistor. However, since it is electrically isolated, the voltage applied to the control gate 120 is coupled to the floating gate 110 via a ratio of capacitance between the inter-gate dielectric 130 and the tunnel oxide 135, and the bias conditions of the adjacent regions.

Tunnel Write.

Writing the cell 100 using Tunnel Write mode of operation involves biasing the drain region 105 and the control gate 120 in such a manner as to create an electric field in the region of the tunnel oxide between the drain 105 and the floating gate 110, such that electrons will tunnel from the drain region to the floating gate. In the example of the NFET memory cell 100, the drain region 105 could be set at ground 0 volts, the source region 115 could be set at 5 volts, while the control gate 120 is biased to a high voltage e.g., 15 volts. As was the case with Channel Hot Electron mode of operation, the actual voltage on the floating gate 110 is defined by capacitive coupling between the floating gate 110 and all adjacent regions. Note that the currents required to Tunnel are much less than those required to inject electrons by Channel Hot Electrons.

Tunnel Erase.

The erase operation is identical in the Channel Hot Electron Write mode and in the Tunnel Write mode of operation. To erase the cell 100, the source region 115 is biased to a relatively high potential, and the control gate 120 is biased to a negative potential such that a high electric field is produced across the tunnel oxide which will allow tunneling of electrons from the floating gate 110 to the source 115. For example, in a NFET memory cell 100 the source 115 may be biased to 8 volts while the control gate 120 is biased to negative 6 volts.

As was the case during the Tunnel Write, the voltage on the floating gate 110 defines the field across the tunnel oxide. Since floating gate 110 is electrically isolated, the voltage is defined by capacitance ratios between the inter-gate dielectric and the tunnel oxide considering the voltages applied to the adjacent regions, i.e., the source 115, the drain 105, and the channel 125. Writing the cell is an act of adding electrons to the floating gate 110, while erasing the cell is an act of removing electrons from the floating gate 110. It may also be shown that channel region 125 is conductive in the case of an erased NFET cell, while it does not conduct current readily in the written state.

One method to reduce the high NVRAM programming voltages is scaling or reducing the thickness of the tunnel oxide 135 located between a floating gate 110 and the source 115. However, thin tunnel oxides have been associated with the loss of the stored charge on the floating gate 110, so called retention fails. Thus, such cell cannot be used as non-volatile memory. Accordingly, there is a need to provide an NVRAM cell that operates properly at low voltages, without further reducing the thickness of the tunnel oxide and thus, avoiding problems associated with thinner tunnel oxide layers.

SUMMARY OF THE INVENTION

The object of the present invention is to provide a non-volatile random access memory (NVRAM) cell that operates at low voltages, and a method making thereof, that eliminate the problems of conventional NVRAM cells.

Another object of the present invention is to provide an NVRAM cell with increased carrier tunneling without reducing the thickness of the tunnel oxide.

Yet another object of the present invention is to provide an NVRAM cell with high electric field regions that facilitate carrier tunneling for writing and/or erasing of charges stored on the floating gate.

These and other objects of the present invention are achieved by a non-volatile random access memory (NVRAM) cell that includes a substrate having source and drain regions. A spike, having a tip, extends in one of the source or the drain regions, or both and a spike tip extending from the drain region toward the floating gate. The spike facilitates tunneling of charges between the floating gate and the source region. In particular, in the embodiment of the present invention where the spike tip that extends from the floating gate into the source region provides a high electric field that facilitates tunneling of charge carriers from the floating gate to the source region, charges stored in the floating gate are thus removed or erased. In the embodiment where the spike tip that extends from the drain into the floating gate provides a high electric field that facilitates tunneling of charge carriers from the drain region to the floating gate, charges are stored in the floating gate or written.

In another embodiment, instead of a single spike, two adjacent spikes are included in the source and in the drain, for example. The two adjacent spikes have one tip pointing toward the floating gate and two tips pointing away from the floating gate. The two adjacent spikes with the three tips create bi-directional high field electron injection points that facilitate charge movement between the drain or the source regions and the floating gate. The spike tips that cause a high electric field reduce voltage levels required for erase and write operations of the NVRAM cell.

The single spike is formed by etching the substrate through an opening formed in a Patterned Nitride Layer that covers the substrate. The substrate is etched using anisotropic etches, which etch specific crystallographic orientations faster than other orientations. Prior to etching the substrate to form the spike, spacers are formed on the sidewalls of the opening in the nitride layer to reduce the width of the opening to a sub-lithographic size. The side spacers may be omitted if the lithographic image can be made small enough directly.

The two adjacent spikes are formed by first forming spacers on sidewalls of the opening to reduce a width thereof; filling the reduced opening with a mask plug; removing the sidewalls; and etching the substrate using similar methods previously described.

BRIEF DESCRIPTION OF THE DRAWINGS

Further features and advantages of the invention will become more readily apparent from a consideration of the following detailed description set forth with reference to the accompanying drawings, which specify and show preferred embodiments of the invention, wherein like elements are designated by identical references throughout the drawings; and in which.

DETAILED DESCRIPTION OF THE INVENTION

Figure 1:
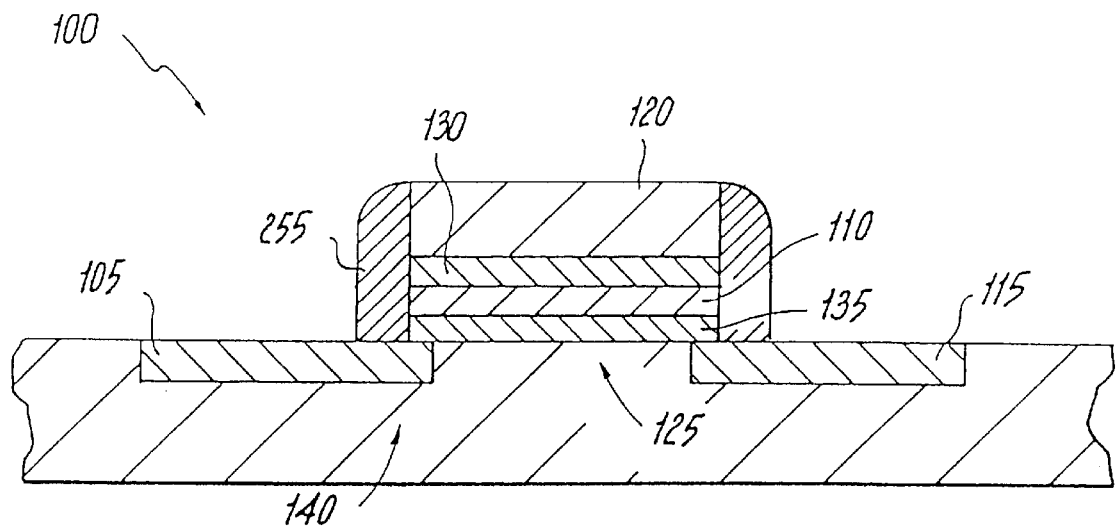
FIG. 1 shows a cross section of a conventional non-volatile random access memory (NVRAM) cell.
Figure 2:
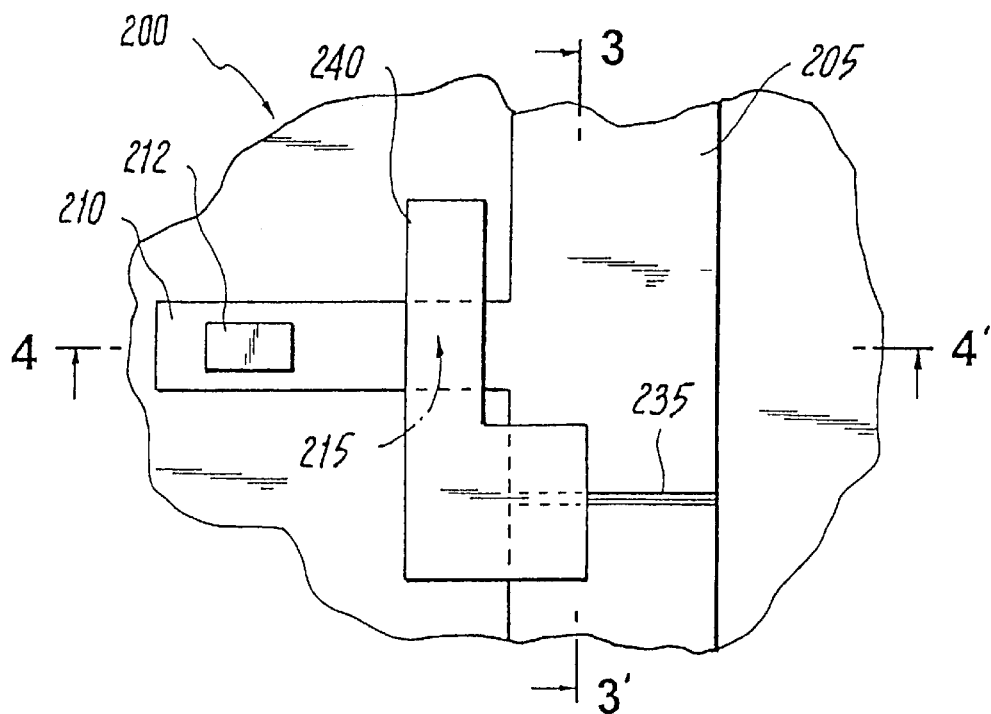
FIG. 2 is top view of a layout of a memory cell according to the present invention.

FIG. 2 is top view of a layout of a non-volatile random access memory (NVRAM) cell memory cell with a stack gate transistor 200 according to the present invention. For simplicity, only the floating gate transistor is shown. It is understood that a circuit means is provided for addressing the cell using standard addressing techniques. Several of the memory cells may be arranged in rows and columns to form an array of memory cells. The source region, shown as reference numeral 205 in FIG. 2, is a strip of heavily doped region that forms a common source-region of different NVRAM cells in an array of memory cells.

Figure 3:
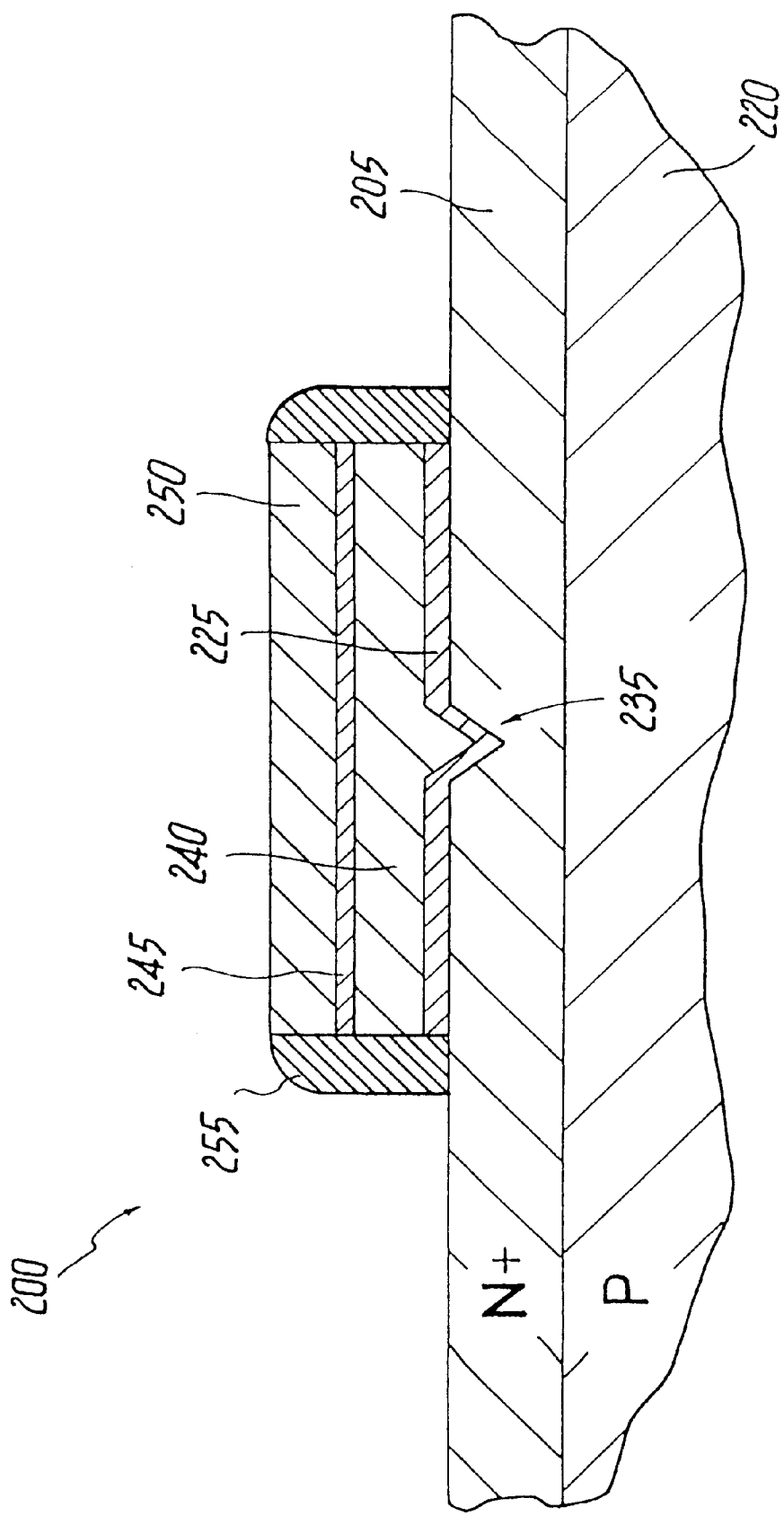
FIG. 3 shows a cross section of the memory cell shown in FIG. 2 along the line 3–3' according to the present invention.

As shown in FIG. 2, the stack gate transistor 200 has the source region 205 and the drain region 210 separated by the channel regions 215. Illustratively, the source and the drain regions 205, 210, heavily doped with N-type material, are formed in a substrate doped with P-type material. FIG. 2 also shows a drain contact 212 formed over a portion of the drain 210. A floating gate 240 is formed over a tunnel oxide layer 225 (FIG. 3) that isolates the floating gate 240 from the underlying substrate 220 (FIG. 3). The floating gate 240 overlaps the channel 215 and portions of the source 205.

Figure 4:
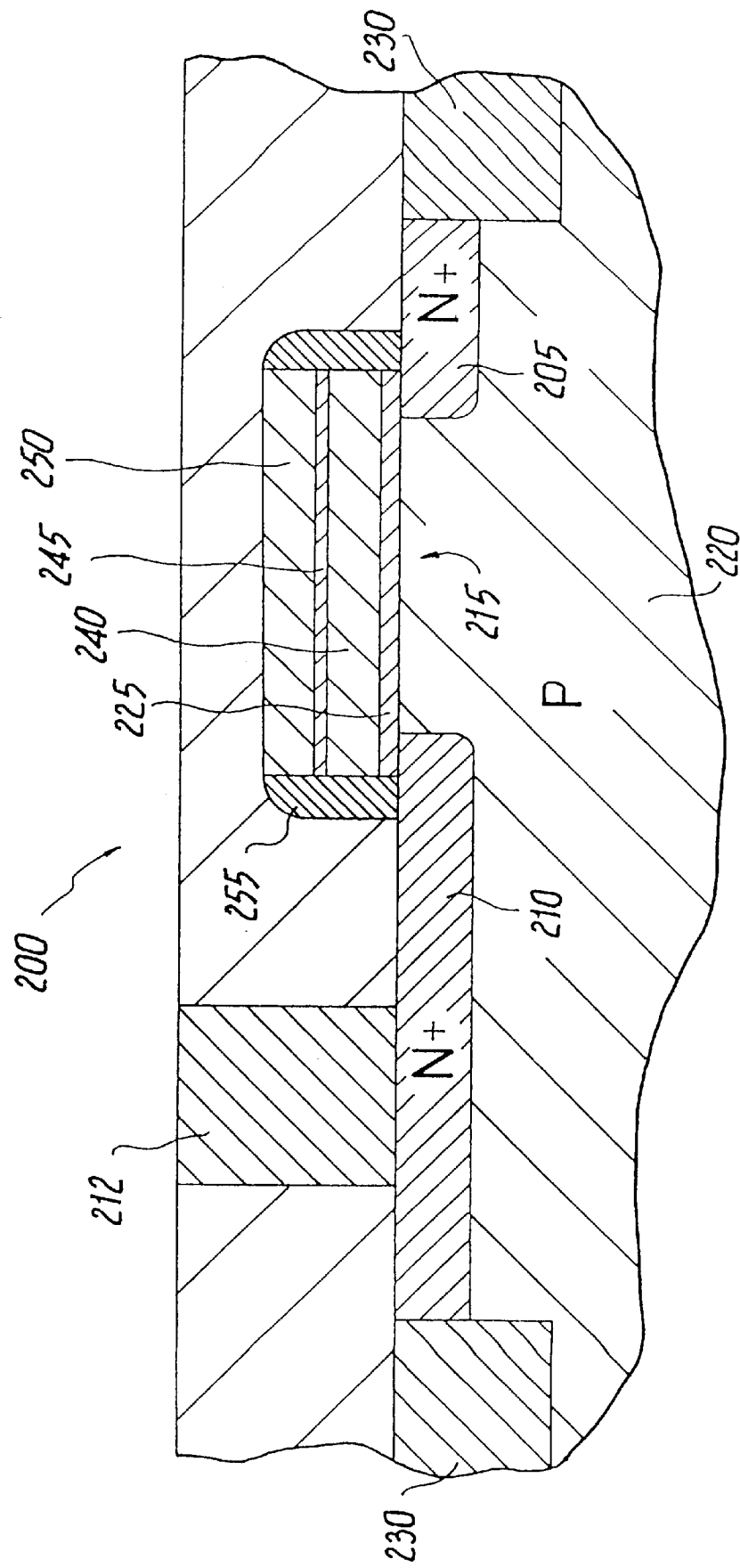
FIG. 4 shows a cross section of the memory cell shown in FIG. 2 along the line 4–4' according to the present invention.

FIGS. 3 and 4 show cross sections of the floating gate transistor 200 shown in FIG. 2 along the lines 3–3' and 4—4, respectively. In FIGS. 3 and 4, a semiconductor substrate such as silicon, shown as reference numeral 220, having the source and the drain regions 205, 210 formed therein. As shown in FIG. 4, the source and the drain regions 205, 210 are separated by the channel 215, which is located below the floating gate 240. A dielectric layer 225 such as a tunnel oxide layer, is formed between the floating gate 240 and the channel 215. FIG. 4 shows shallow trench isolation (STI) regions 230 which provide electrical isolation between different memory cells of the array to separate the stack gate transistor 200 from adjacent devices in the memory cell array.

As shown in FIG. 3, an inter-gate dielectric layer 245, such as an ONO layer, is formed over the floating gate 240 and a control gate 250 is formed on the inter-gate dielectric layer 245. Sidewall dielectric spacers 255, such as nitride spacers, surround the floating and the control gates 240, 250. Thus, the floating gate 240 is completely encapsulated by insulating material, namely, by the tunnel oxide 225 and the inter-gate dielectric layer 245 and the nitride spacers 255.

As shown in FIG. 3, at least one spike 235 having a sharp tip extends into the source (or the drain) 205 of the floating gate transistor 200. The downward facing spike, i.e., having its sharp tip extending in the source 205 away from the floating gate 240, provides a high electric field with a relatively low voltage difference between the floating gate 240 and the source 205. The high electric field facilitates tunneling of electrons across the tunnel oxide 225 into the source region 205 at reduced source voltage for erasing.

As shown in FIG. 2, the floating gate 240 has an L-shape, for example, with one leg of the L-shape overlapping the channel 215, and the other leg of the L-shape overlapping portions of the source 205. The spike 235 is shown in FIG. 2 as a line representing the sharp tip of the spike, which extends across the source 205. One portion of the spike 235 is under the portion of the floating gate 240 that overlaps the source 205.

Figure 5:
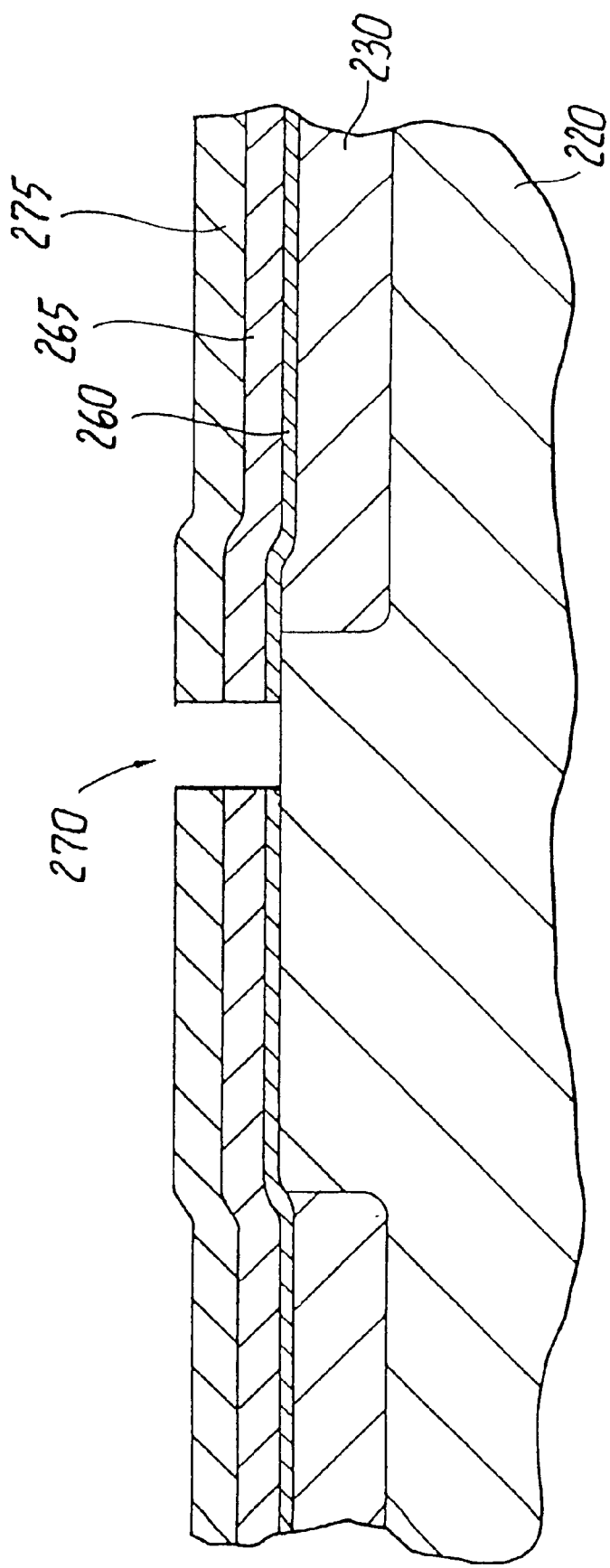
FIGS. 5–8 show a method of forming the memory cell of FIG. 2 according to the present invention.
Figure 6:
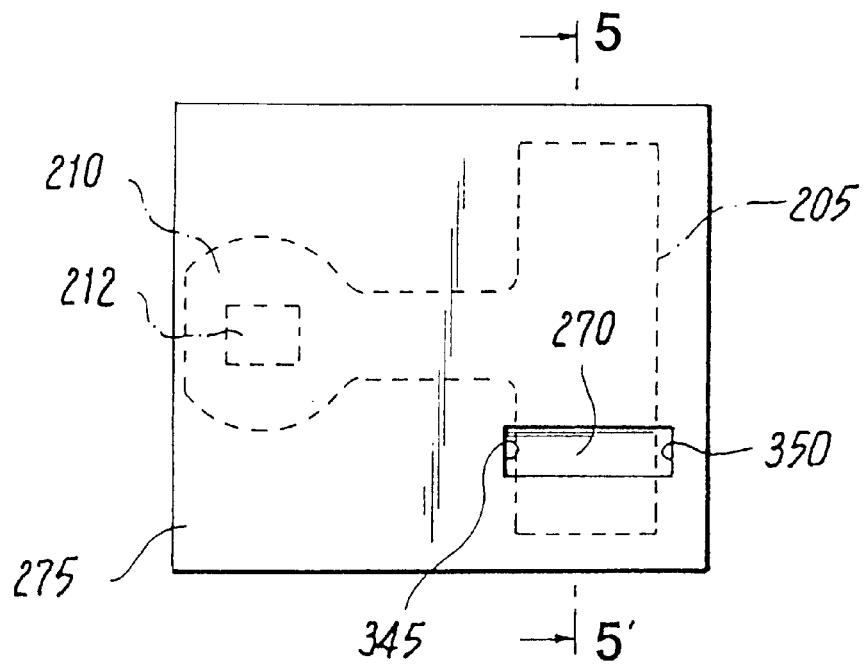
Figure 7:
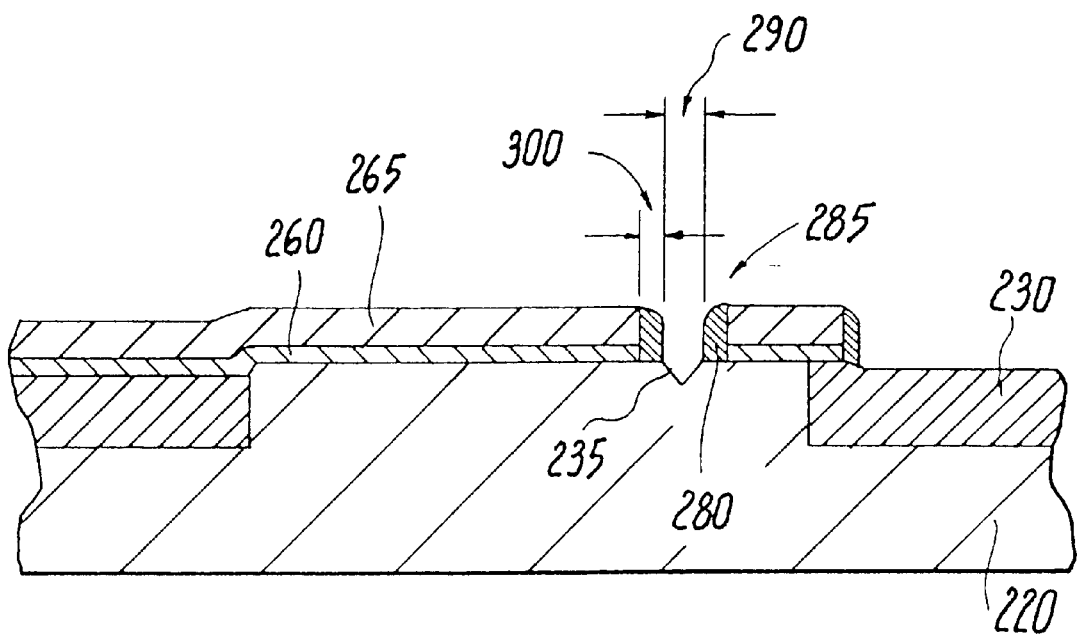
Figure 8:
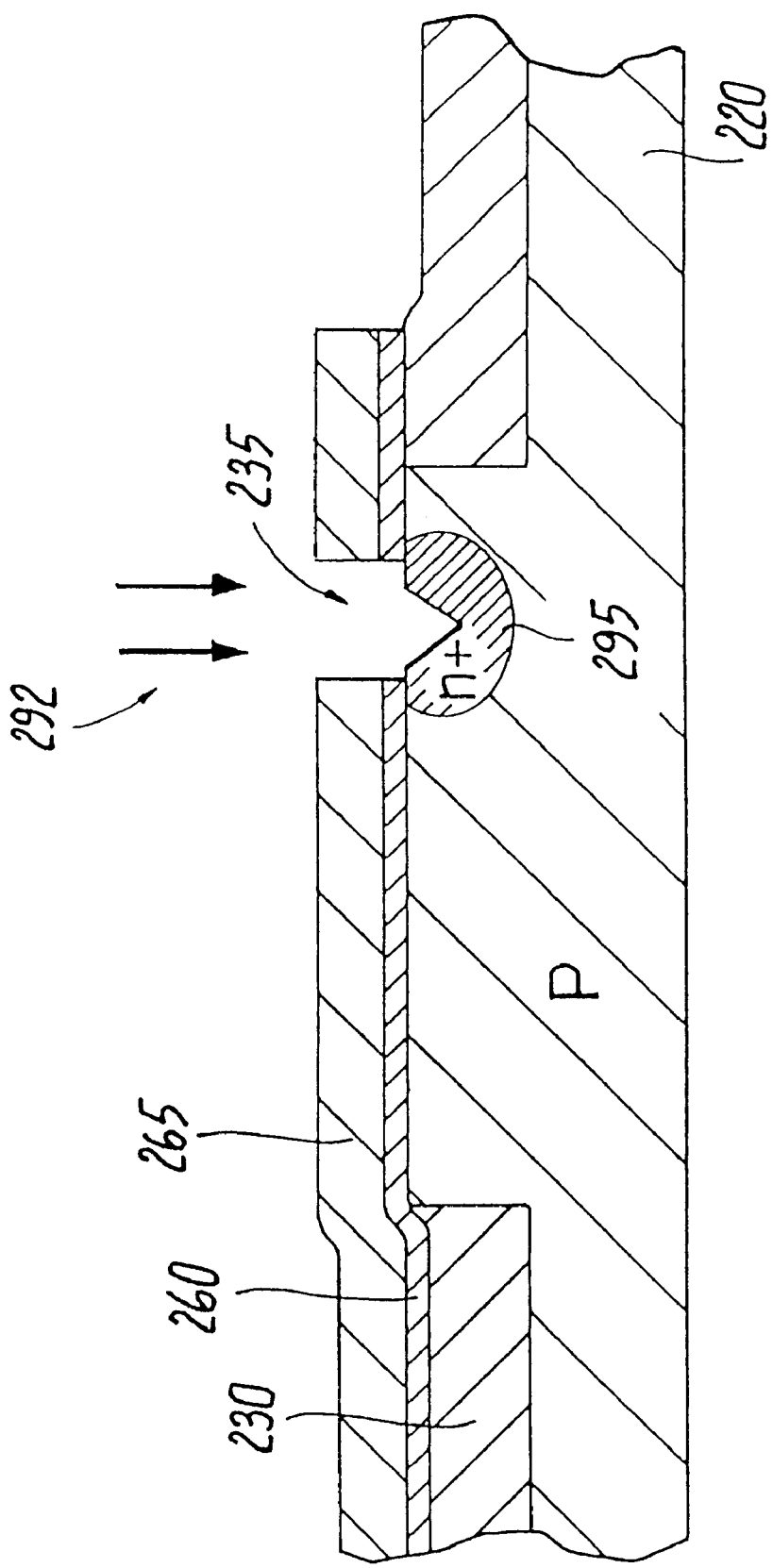

FIGS. 5–8 show steps of a method of forming the memory cell of FIG. 8. As shown in FIG. 5, STI regions 230 are formed in the substrate 220. After STI processing is completed, a thin oxide layer 260 and a thick nitride layer 265 are respectively formed on the entire silicon wafer with a crystal orientation of 100, for example. Illustratively, the thickness of the thin oxide layer 260 is approximately 10 nm, and the thickness of the nitride layer 266 is approximately 100 nm.

An opening 270 is formed though the oxide and the nitride layer, 260, 265 using conventional lithographic methods. For example, the nitride layer 265 is patterned using a mask 275 formed thereon. The nitride layer 265 is etched to expose portions of the underlying oxide layer 260, which is etched to form the opening 270. As shown in the top view of FIG. 6, where FIG. 5 is a cross-sectional view along the line 5–5' of FIG. 6, the opening 270 is formed over a portion of a site where the common source 205 of the NVRAM cell will be formed later. The source and the drain regions 205, 210 are shown to relate the location of the opening 270 thereto. However, as will be explained, the source and the drain regions 205, 210 are formed after completing the gate structure, which includes the floating and the control gates.

After forming the opening 270, as shown in FIG. 7, the mask 275 (FIG. 5) is removed. Spacers 280, such as tetra ethyl ortho silicate (TEOS) spacers, for example, are then formed on sidewalls of the opening 270 (FIG. 5) to reduce its width to a sub-lithographic size and form a sub-lithographic opening 285. Illustratively, the reduced width 290 of the sub-lithographic opening 285 is 1000 Å.

The wafer is anisotropically etched in KOH, for example, which etches preferentially along the 100 crystal plane of the silicon substrate 220. This etches the substrate faster along one crystallographic orientation, e.g., the 100 crystal plane, faster than other orientations. The preferential etching along the 100 crystal plane leaves the 111 plane exposed and creates the spike 235 with the point facing downward in the silicon substrate 220.

The TEOS spacers 280 are removed, selectively with respect to nitride, by wet etching in a hydrofloric acid. Then, as shown in FIG. 8, an ion implantation 292 may be performed to form a diffusion region 295 in a portion of the substrate 220 that surrounds the spike 235. The nitride acts as a mask layer 265 for this optional implantation. The width 300 (FIG. 7) of the removed TEOS spacers 280 provides enough overlay tolerance to guarantee that the diffusion 295, which will be under the floating gate 240 (FIG. 3) formed thereon, links up with the source diffusion 205 (FIG. 3).

Next, the nitride and the oxide layers 260, 265 are removed and conventional NVRAM processing is performed to form the stacked gate transistor 200 shown in FIG. 3. In particular, the tunnel oxide 225 is formed over the substrate. The tunnel oxide 225 also lines the spike 235. Next, the floating gate 240 is formed followed by the inter-gate dielectric layer 245 and the control gate 250. Spacers 255 are formed around the gate stack to completely isolate the floating gate 240.

After forming the floating and the control gates 240, 250, the source and the drain regions 205, 210 are formed by ion implantation. If necessary, annealing may be performed to link or merge the source implant or diffusion with the diffusion region 295 (FIG. 8) located under the floating gate 240 (FIG. 3) near the spike 235.

Upon application of a relatively low voltage on the control gate, such as 5 to 6 volts, a high electric field is created at the tip of the spike 235. The high electric field facilitates electron tunneling from the floating gate 240 to the source 205 for erasing charges stored on the floating gate.

For a low voltage write operation to an individual cell in addition to the low voltage erase operation previously described, an electron transfer in both directions i.e., to and from the floating gate must be achieved. This may be accomplished by forming a spike structure with a tip in the drain region of the cell in addition to a spike structure with a tip in the source region of the cell for erasing the charge.

Figure 9:
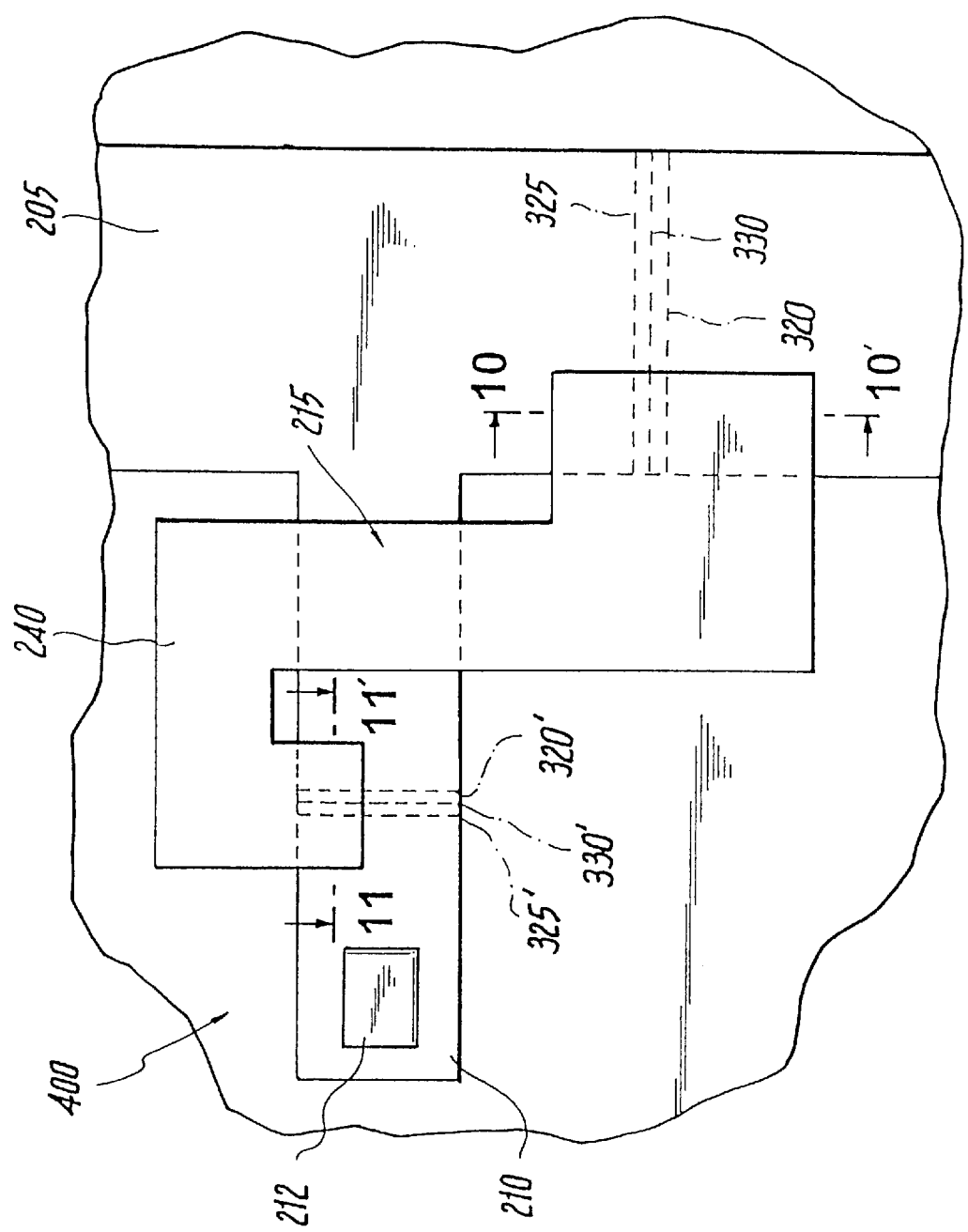
FIG. 9 is top view of a layout of a memory cell according to another embodiment of the present invention.

FIG. 9 shows a top view layout of the stack gate transistor 400 having three adjacent spike tips 320, 325, 330 shown by lines extending across the source region 205, instead of the single spike 235 on the source region 205 shown in FIG. 2. Additionally, the three adjacent spike tips 320', 325', 330' are shown by lines extending across the drain region 210. The floating gate 240 has a Z-shape with one leg of the Z-shape, similar to FIG. 2, overlapping a portion of the spikes in the source diffusion 205 another leg of the Z-shape overlaping a portion of the spikes in the drain diffusion 210. The middle section of the Z-shape is overlaping the channel 215.

Figure 10:
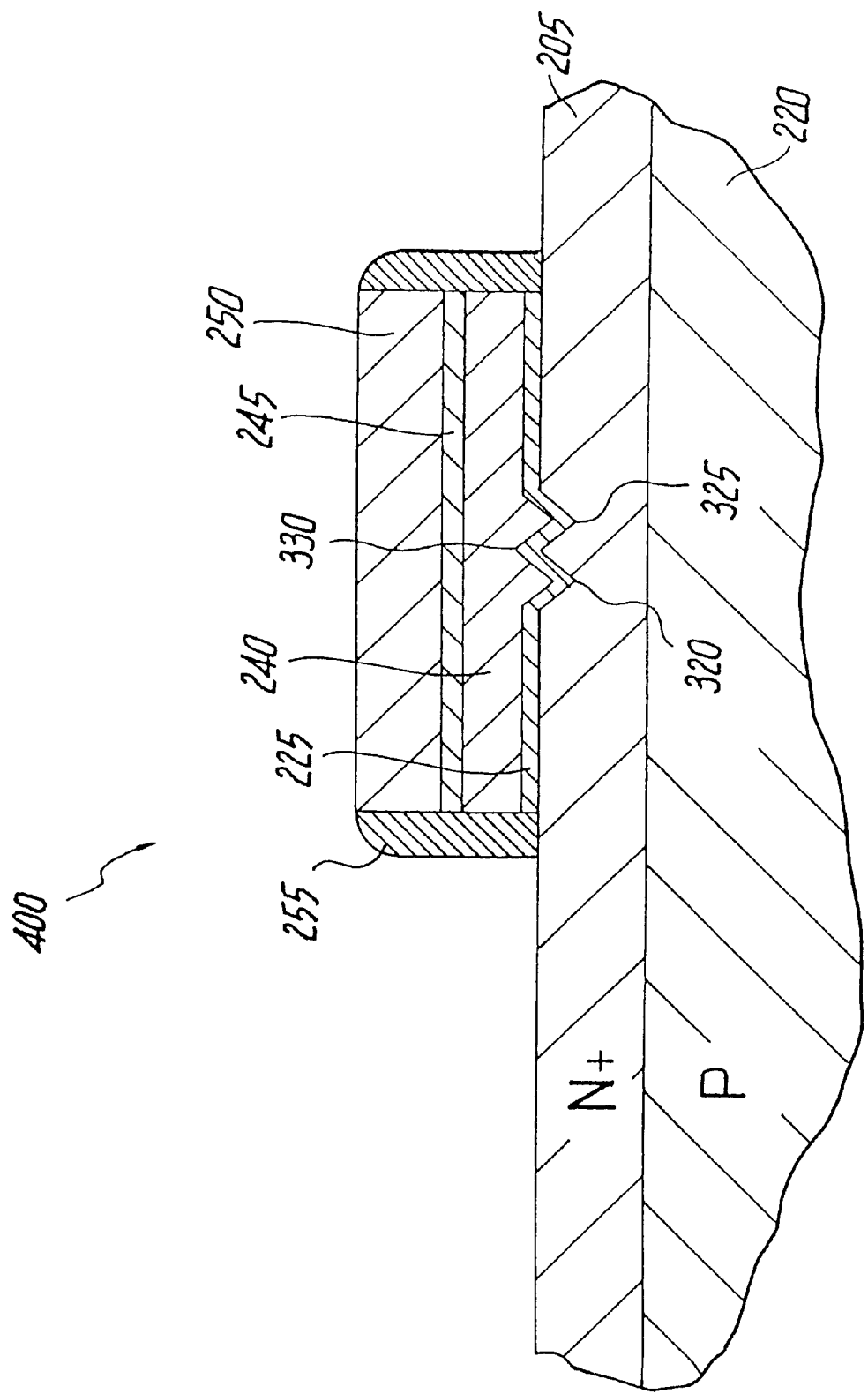
FIG. 10 shows a cross section of the memory cell shown in FIG. 9 along the line 10–10' according to the present invention.
Figure 11:
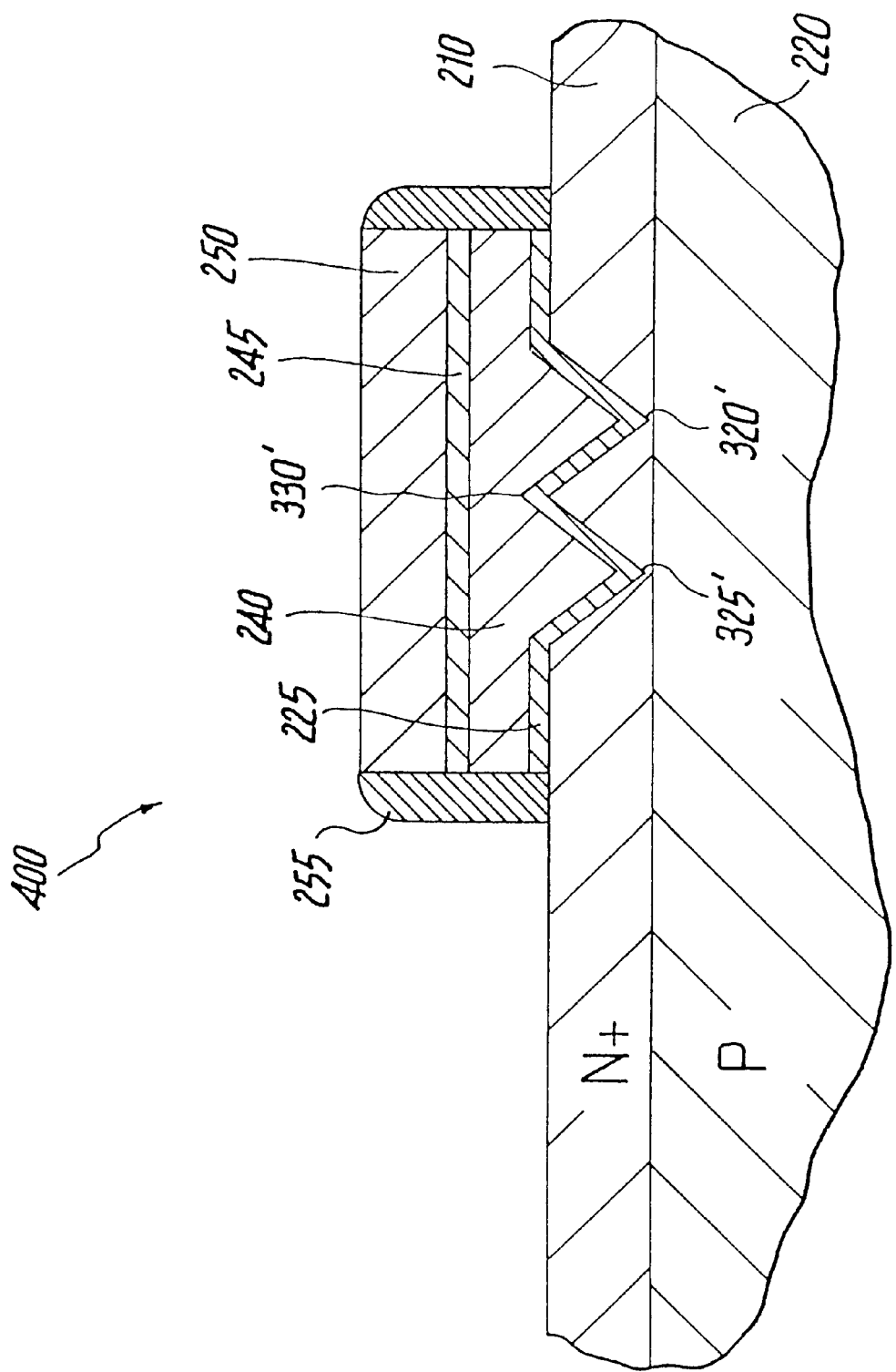
FIG. 11 shows a cross section of the memory cell shown in FIG. 9 along the line 11–11' according to the present invention.

FIGS. 10 and 11 are cross sectional views along the line 10–10' and the line 11–11' of FIG. 9. FIG. 10 shows a first pair of adjacent spikes with two tips 320, 325 pointing down into the common source 205 and a third tip 330 pointing up toward the floating gate 240. FIG. 11 shows two spike tips 320', 325' pointing down into the drain 210 and a third tip 330' pointing up toward the floating gate 240. Having an upward pointing tip facilitates storing (or writing) the charge on the floating gate 240.

Figure 12:
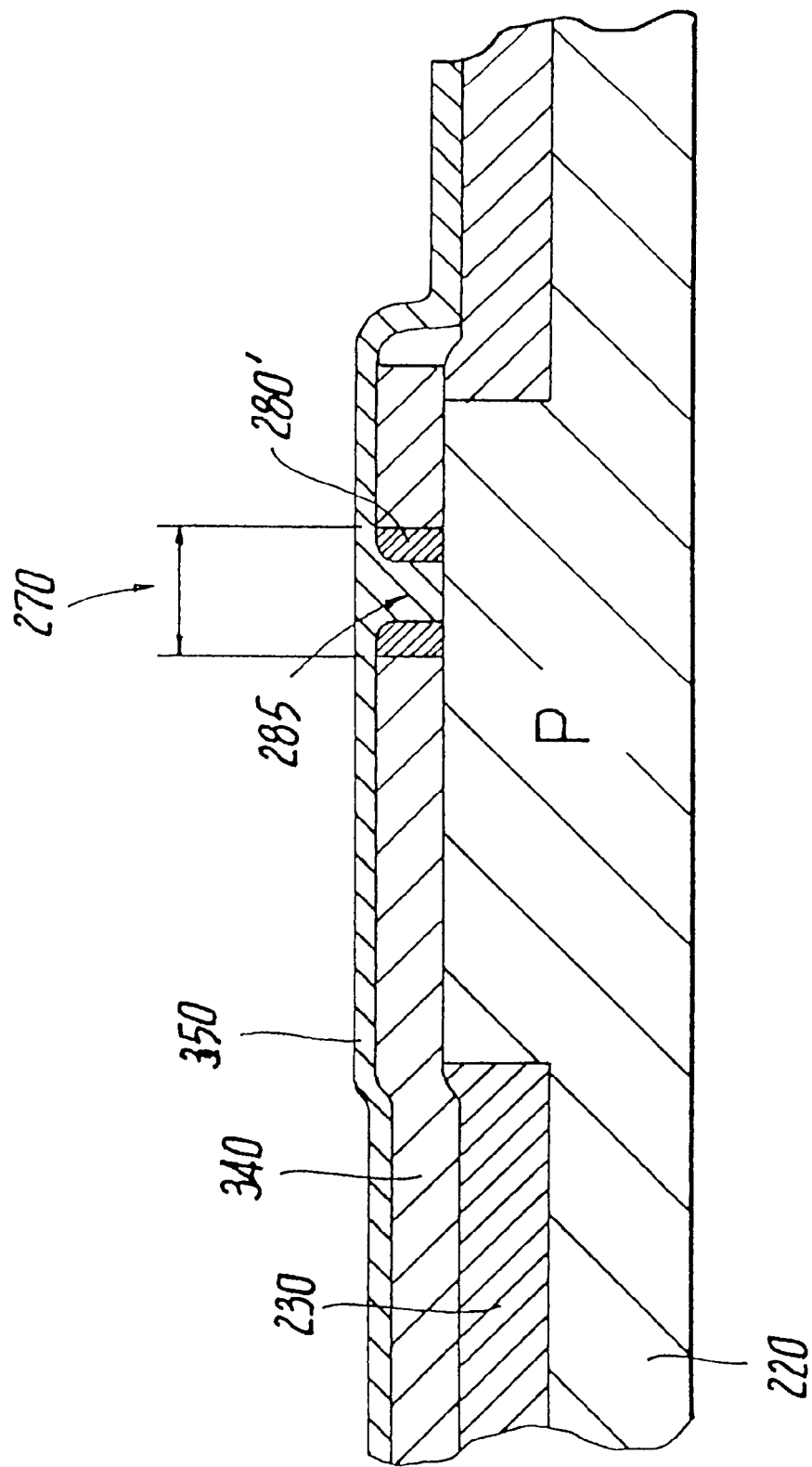
FIGS. 12–16 show a method of forming the memory cell of FIG. 9 according to the present invention.
Figure 13:
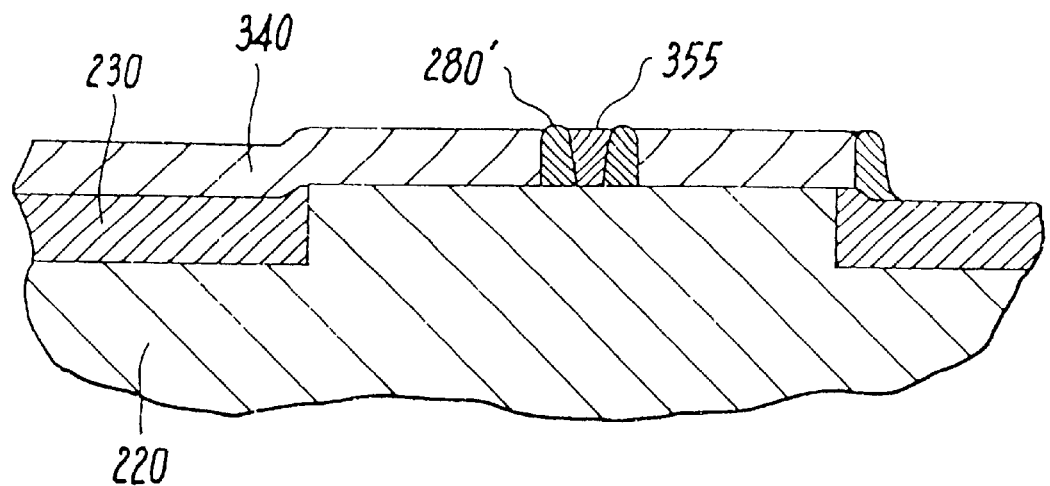

FIGS. 12–16 show a method of forming the stack gate transistor 400 of FIG. 9. Similar to that described in connection with FIG. 6, FIG. 12 shows the opening 270 formed in a mask 340. The opening 270 is in portions of the substrate where the source region 205 and the drain region 210 will be formed at a later time.

As shown in FIG. 12, a patterned undensified TEOS layer 340 is formed over the entire silicon wafer after STI processing and define areas to be etched by an anisotropic etch, for example. Illustratively, the silicon substrate 220 has a crystal orientation of 100, and the patterned layer 340 is a layer of undensified TEOS having a thickness of approximately 150 nm.

Figure 15:
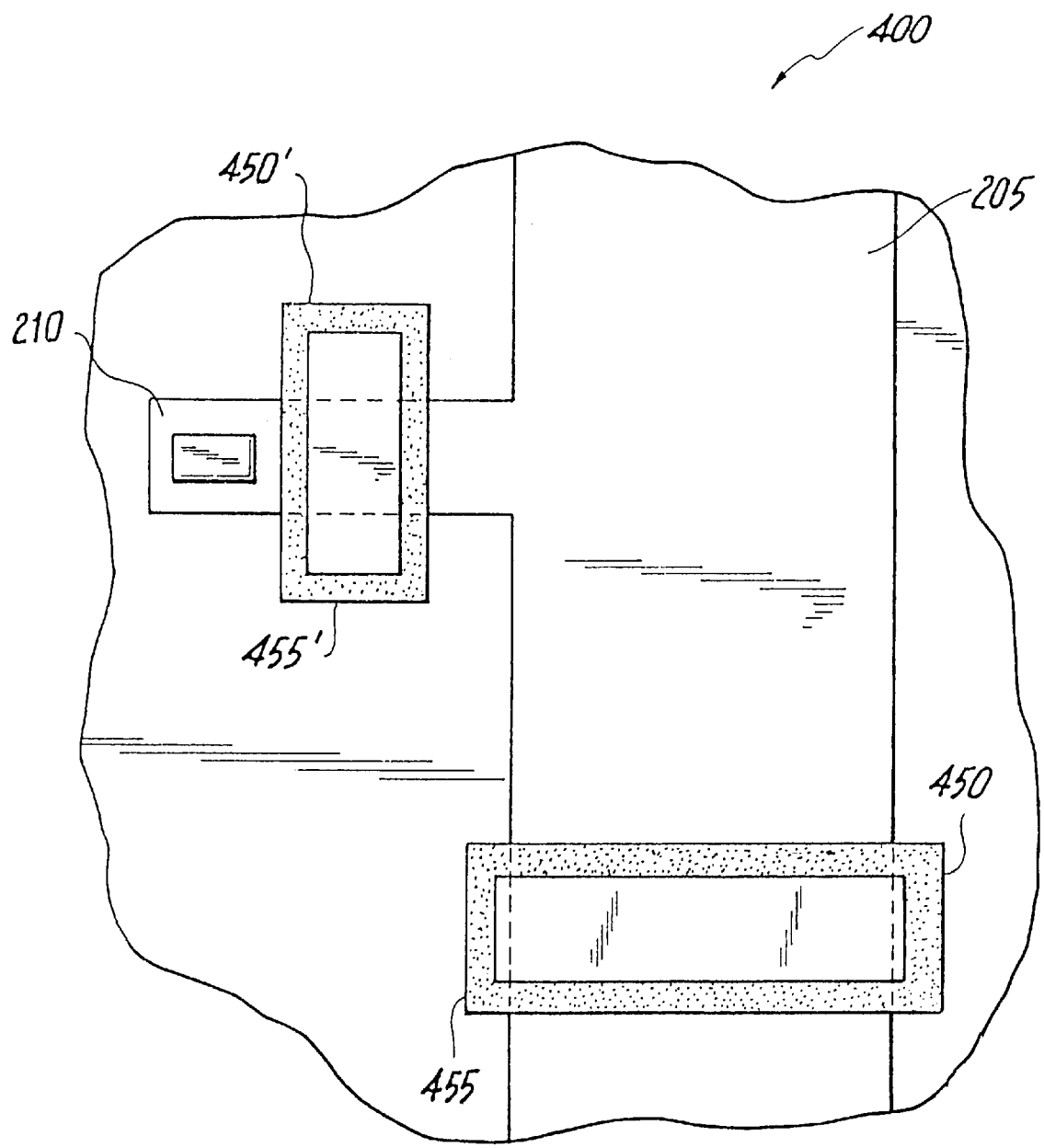

Similar to that described in connection with FIG. 5, an opening 270 is formed in the TEOS mask 340 to expose portions of the common source and the drain of the NVRAM cell, which are formed later, for example. As shown in FIG. 15, the opening 270 extends over the single crystal from one STI edge 450 to the other edge 455 located across the common source region 205 and from one STI edge 450' to the other edge 455' located across the drain region 210.

Figure 16:
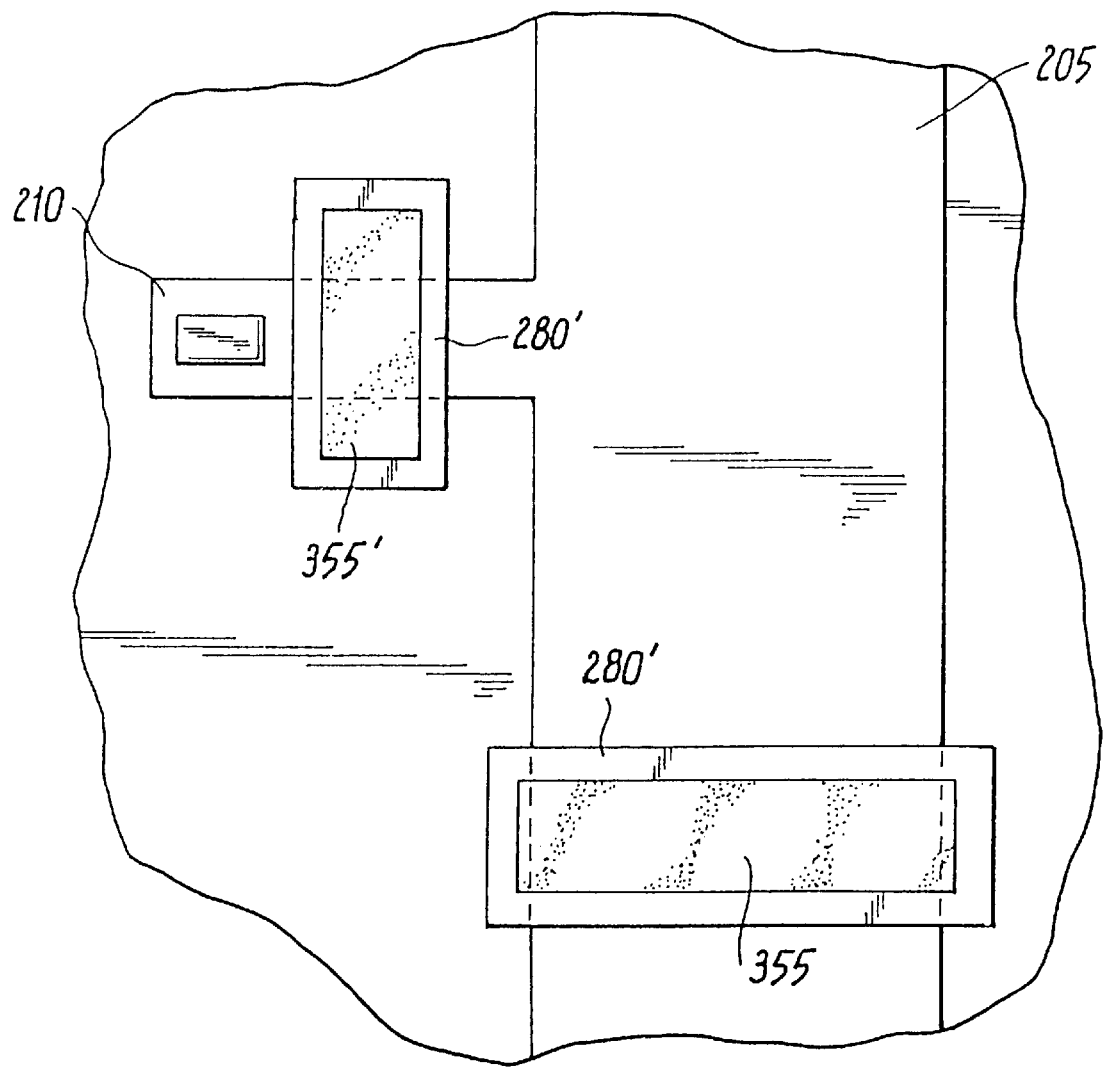

Similar to that described in connection with FIG. 7, FIG. 12 shows spacers 2801, e.g., nitride spacers, formed on sidewalls of the opening 270 to create a sub-lithographic stripe 285 in the TEOS layer 340. A second undensified TEOS layer 350 is formed over the first TEOS layer 340. The second TEOS layer 350 completely fills the sub-lithographic stripe 285. This second TEOS layer is anisotropically etched below the top of nitride spacers forming a TEOS plug 355 shown in FIG. 14. FIG. 16 shows the top view of the NVRAM cell 400 having one TEOS plug 355 over the source region 205 and one TEOS plug 355' over the drain region 210.

Figure 14:
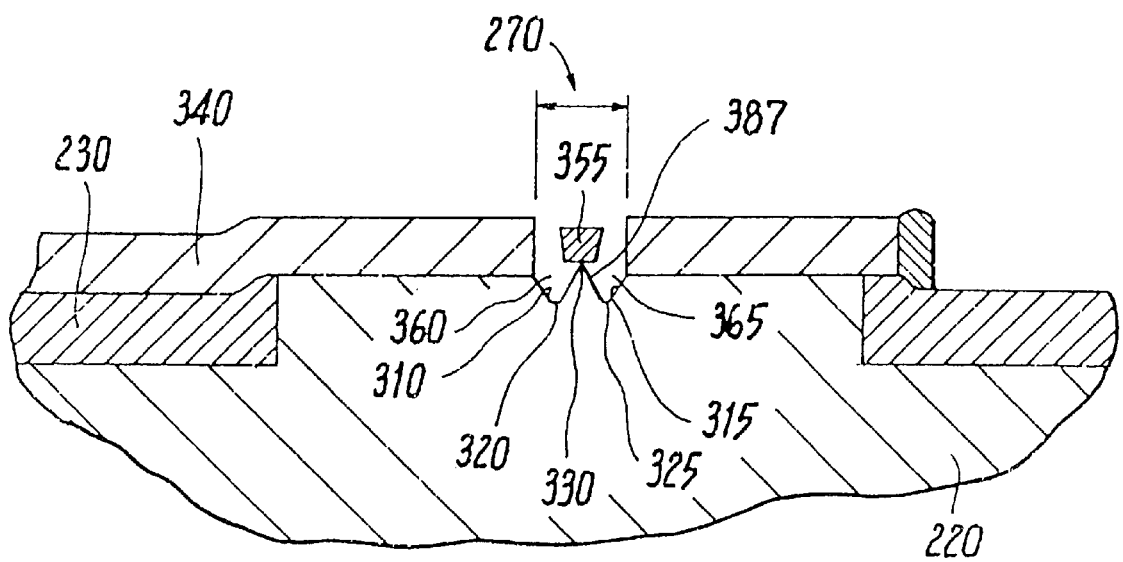

Next, the nitride spacers 280' are removed using a hot phosphoric bath, for example. As shown in FIG. 14, this results in a sub-lithographic 'donut' in which the TEOS plug or strip 355 is centered within the larger TEOS opening 270. The TEOS plug or strip 355 is supported by the STI and partially covers the single crystal silicon of the substrate which is exposed through the opening 270 and can be implanted and diffused with impurities to merge with the source 205 and with the drain 210 (FIG. 10), where the source 205 and the drain 210 will be formed after forming the floating and the control gates, for example.

As shown in FIG. 14, the wafer is etched in KOH for example, which etches the substrate portion exposed on both sides 360, 365 of the TEOS plug or strip 355. Illustratively, the silicon substrate is etched preferentially along the (100) crystal plane. This creates two adjacent spikes 310, 315 on each side 360, 365 of the TEOS plug or strip 355, and leaves the (111) plane exposed. Each of the two spikes 310, 315 have its point 320, 325 facing downward into the silicon substrate 220. Further, a third spike 387 having a point 330 facing away from the substrate 220 or toward the TEOS strip 355 is formed. The sharp point or tip 330 of the third spike 387 is centered along and under the TEOS strip 355.

The dimension of the spacers 280' (FIG. 13) and the length of etch time may be varied to achieve a desired etch profile to result in desired spikes having two tips or points 320, 325 facing down into the substrate 220, and a third tip or point 330 facing up away from the substrate 220 i.e., toward the TEOS strip 355.

If necessary or desired, the exposed silicon in the substrate region around the TEOS strip 355 and spikes 310, 315, may be implanted, using the patterned TEOS film as a mask, to form an N$^+$ diffusion region, similar to that shown in FIG. 8 as numeral 295, for merging or linking with the diffusion region formed, for example, after implanting the source and the drain regions 205, 210 of the stack gate transistor 400 (FIGS. 10, 11).

Alternatively, a block level and implant is performed if desired or necessary, for example, when the thickness of the TEOS mask 280' is not a sufficient block mask. If necessary, an additional mask and implant may be performed to provide good electrical contact between the diffusion near the spikes 310, 315, (which diffusion will be under the floating gate after forming thereof) and the source or the drain diffusion formed after forming the floating and the control gates. After forming the diffusion region around the spikes 310, 315, the undensified TEOS 340 is removed, e.g., wet etched.

As shown in FIG. 9, two pairs of adjacent spikes are formed by this embodiment of the invention. The first pair, as shown in FIG. 10, is located in the part of the silicon substrate 220 which will become the drain region 210. FIG. 10 shows spike tips 320, 325 facing downward into the source region 205 and a third spike tip 330 facing away from the substrate 220 into the floating gate portion of the stack. FIG. 11 shows spike tips 320', 325' facing downward into the silicon substrate portion, which will become part of the drain region 210 and a third spike tip 330' facing away from the substrate 220 into the floating gate portion of the stack. The etching operation to create spikes in the drain region 210 of the NVRAM cell 400 shown in FIG. 11, is the same operation described for the creation of spikes in the source region 205.

FIGS. 9, 10 and 11 show the NVRAM cell 400 completed by performing the conventional NVRAM processing similar to that described earlier, such as forming the floating and the control gates 240, 250, separated by the gate oxide 245; forming the source and the drain regions 205, 210; forming the spacers 255 to encapsulate the floating gate 240; and other conventional steps, such as forming the drain contact 212, passivation and metalization.

It is understood that the actual operation conditions of the NVRAM cell 400 (FIG. 10), are a function of the tunnel oxide thickness, the inter-gate dielectric thickness, and cell design geometries. As an example, the following voltages are used to write the cell:

Control gate voltage: high, e.g., 8v,
Source line voltage: intermediate, e.g., 3v, and
Drain line voltage: low, e.g., 0v.
The following voltages are used to erase the cell:
Control gate voltage: low, e.g., 0v,
Source line voltage: high, e.g., 8v, and
Drain line voltage: intermediate, e.g., 3v.

Further embodiments include cells which have a single spike in one of the doped regions, e.g. in the source, and two spikes in the other doped region, e.g. in the drain. Alternatively, both the source and the drain regions may have a single spike.

While the invention has been particularly shown and described with respect to illustrative and preformed embodiments thereof, it will be understood by those skilled in the art that the foregoing and other changes in form and details may be made therein without departing from the spirit and the scope of the invention which should be limited only by the scope of the appended claims.

Having thus described our invention, what we claim as new, and desire to secure by Letters Patent is:

1. A method of fabrication a non-volatile semiconductor device comprising the steps of:
    forming a first spike which extends into a first region in a substrate;
    forming a first spike doped region in said first region through said spike;
    forming a dielectric layer over said substrate;
    forming a floating gate over said dielectric layer for storing charges; and
    doping said first region and a second region in said substrate, said first region extending toward said first spike to merge with said first spike doped region.

2. The method of claim 1 further comprising the steps of:
    forming a gate dielectric over said floating gate;
    forming a control gate over said gate dielectric; and
    forming spacers on sidewalls of said floating and said control gates.

3. The method of claim 1, wherein the first spike forming step includes the steps of:
    forming a mask over said substrate;
    forming an opening in said mask to expose a portion of said substrate;

etching said exposed substrate portion to form said first spike.

4. The method of claim 3, wherein the first spike forming step includes the step of forming spacers along sidewalls of said opening to reduce a width of said opening to a sublithographic size.

5. The method of claim 3, wherein the etching step is performed using an etchant which preferentially etches along a selected crystal plane of the substrate to form said first spike having a tip that extends into said substrate.

6. The method of claim 1, wherein the floating gate forming step forms said floating gate over a portion of said first region and over a channel portion of said substrate located between said first and said third regions.

7. The method of claim 1, wherein the first spike forming step facilitates tunneling of said charges between said floating gate and said first region.

8. The method of claim 1 further comprising forming a first spike which extends into said second region in said substrate.

9. The method of claim 8 further comprising foaming a second spike which extends into said first region, said second spike being adjacent to said first spike, said first and second adjacent spikes having one tip pointing toward said floating gate and two tips pointing toward said first region.

10. The method of claim 9 further comprising forming a second spike which extends into said second region, said second spike being adjacent to said first spike, said first and second adjacent spikes having one tip pointing toward said floating gate and two tips pointing away from said second region.

11. The method of claim 1, wherein the second spike forming step includes the steps of:

forming a mask over said substrate;

forming an opening in said mask to expose a portion of said substrate;

forming spacers along sidewalls of said opening to reduce a width of said opening;

forming a mask plug in said reduced opening;

removing said spacers to exposed portions of said substrate; and etching said exposed substrate portions to form two adjacent spikes having one tip pointing toward said dielectric layer and two tips pointing away from said dielectric layer.

12. The method of claim 11 further comprising removing said mask and said mask plug.

13. The method of claim 11, wherein the etching step preferentially etches along a selected crystal plane of the substrate.

14. The method of claim 10, wherein the floating gate forming step forms said floating gate over a portion of said first region, a portion of said second region and over a channel portion of said substrate located between said first and said third regions.

15. The method of claim 10, wherein the first and the second spike forming step Facilitates tunneling of said charges from said floating gate to said first region and from said first region to said floating gate.

* * * * *